United States Patent
Murali et al.

(10) Patent No.: US 8,871,608 B2
(45) Date of Patent: Oct. 28, 2014

(54) METHOD FOR FABRICATING BACKSIDE-ILLUMINATED SENSORS

(75) Inventors: Venkatesan Murali, San Jose, CA (US); Arvind Chari, Saratoga, CA (US); Gopal Prabhu, San Jose, CA (US); Christopher J. Petti, Mountain View, CA (US)

(73) Assignee: GTAT Corporation, Merrimack, NH (US)

(*) Notice: Subject to any disclaimer, the term of this patent is extended or adjusted under 35 U.S.C. 154(b) by 282 days.

(21) Appl. No.: 13/425,877

(22) Filed: Mar. 21, 2012

(65) Prior Publication Data

US 2013/0203205 A1     Aug. 8, 2013

Related U.S. Application Data

(60) Provisional application No. 61/596,694, filed on Feb. 8, 2012.

(51) Int. Cl.
    *H01L 31/0232*     (2014.01)

(52) U.S. Cl.
    USPC ............... 438/455; 438/48; 438/57; 438/479

(58) Field of Classification Search
    USPC ..................... 438/48, 57, 455, 479
    See application file for complete search history.

(56) References Cited

U.S. PATENT DOCUMENTS

| | | | |
|---|---|---|---|
| 4,162,505 A | 7/1979 | Hanak | |
| 5,374,564 A | 12/1994 | Bruel | |
| 6,146,979 A | 11/2000 | Henley et al. | |
| 6,468,884 B2 | 10/2002 | Miyake et al. | |
| 7,339,110 B1 | 3/2008 | Mulligan et al. | |
| 7,633,006 B1 | 12/2009 | Swanson | |
| 7,820,475 B2 | 10/2010 | De Ceuster et al. | |
| 2006/0076590 A1 | 4/2006 | Pain et al. | |
| 2007/0169808 A1 | 7/2007 | Kherani et al. | |
| 2007/0277874 A1 | 12/2007 | Dawson-Elli et al. | |
| 2008/0070340 A1 | 3/2008 | Borrelli et al. | |
| 2008/0078444 A1 | 4/2008 | Atanackovic | |
| 2008/0092944 A1 | 4/2008 | Rubin | |

(Continued)

FOREIGN PATENT DOCUMENTS

KR     20090057435 A     6/2009

OTHER PUBLICATIONS

International Search Report and Written Opinion dated May 27, 2013 for PCT Application No. PCT/US2013/024684.
Office Action dated May 13, 2013 for U.S. Appl. No. 13/425,870.

(Continued)

*Primary Examiner* — Ha Tran T Nguyen
*Assistant Examiner* — Suberr Chi
(74) *Attorney, Agent, or Firm* — The Mueller Law Office, P.C.

(57) ABSTRACT

A method for fabricating a backside-illuminated sensor includes providing a thin film semiconductor lamina having a first conductivity, and forming a doped region having a second conductivity within the lamina and at a front surface of the lamina. The lamina may be provided as a free-standing lamina, or may be provided as a semiconductor donor body from which the lamina is cleaved. An electrical connection is formed to the doped region. A temporary carrier is contacted to the back surface of the semiconductor and later removed. A backside-illuminated sensor is fabricated from the semiconductor lamina, in which the thickness of the semiconductor lamina remains substantially unchanged during the fabrication process.

13 Claims, 5 Drawing Sheets

(56) References Cited

U.S. PATENT DOCUMENTS

| | | |
|---|---|---|
| 2009/0007960 A1 | 1/2009 | Ito et al. |
| 2009/0194162 A1 | 8/2009 | Sivaram et al. |
| 2009/0197368 A1* | 8/2009 | Sivaram et al. ............... 438/73 |
| 2009/0298260 A1 | 12/2009 | Zhu et al. |
| 2010/0032007 A1 | 2/2010 | Hilali et al. |
| 2010/0139755 A1 | 6/2010 | Petti et al. |
| 2010/0240169 A1 | 9/2010 | Petti et al. |

OTHER PUBLICATIONS

Office Action dated Nov. 13, 2013 for U.S. Appl. No. 13/425,870.

D.S.Kim, V. Meemongkolkiat, A. Ebong, B. Rounsaville, V. Upadhyaya, A.Das and A. Rohatgi, "2D-Modeling and Development of Interdigitated Back Contact Solar Cells on Low-Cost Substrates," Proceedings of the 4th IEEE World Conference on Photovoltaic Energy Conversion, May 7-12, 2006, Waikoloa, Hawaii.

Lu, Meijun et al., "Interdigitated back contact silicon heterojunction solar cell and the effect of front surface passivation," Applied Physics Letters 91, 063507, 2007.

Pain et al, A Back-Illuminated Megapixel Cmos Image Sensor, IEEE Workshop on Charge-Coupled Devices and Advanced Image Sensors, Jun. 9-11, 2005, Karuizawa, Japan.

Provoost, and De Moor. "Backside-illuminated Image Sensors: Optimizing Manufacturing for a Sensitivity Payoff." Solid State Technology. PennWell Corporation, Nov. 11, 2011.

U.S. Appl. No. 12/026,530, filed Feb. 5, 2008, entitled "Method to Form a Photovoltaic Cell Comprising a Thin Lamina".

U.S. Appl. No. 12/331,376, filed: Dec. 9, 2008, entitled "Front Connected Photovoltaic Assembly and Associated Methods".

Van Kerschaver, Emmanuel and Guy Beaucarne, "Back-contact Solar Cells: A Review," Prog. Photovolt: Res. Appl. 2006; 14:107-123.

* cited by examiner

METHOD FOR FABRICATING BACKSIDE-ILLUMINATED SENSORS

RELATED APPLICATIONS

This application claims priority to U.S. Provisional Application No. 61/596,694, filed Feb. 8, 2012, and entitled "Method for Fabricating Backside-Illuminated Sensors," which is hereby incorporated by reference for all purposes. This application is also related to Zuniga, U.S. patent application Ser. No. 13/425,870 entitled "Back-Contact Photovoltaic Cell Comprising A Thin Lamina Having A Superstrate Receiver Element," filed on Mar. 21, 2012, and which is hereby incorporated by reference for all purposes.

BACKGROUND OF THE INVENTION

Image sensors receive light and convert the energy into electrical signals based on the amount of light received. Image sensors generally include a silicon light-sensitive layer and electrical circuitry, such as an integrated chip, for processing the electrical signals. It is desirable to increase the pixel density on a chip to improve resolution. However, increasing pixel density creates issues such as crosstalk and denser circuitry wiring.

In frontside-illuminated (FSI) sensors, light enters the "front" of the chip where the metal interconnections lie. Increasing the amount of wiring causes more shadowing and therefore less efficiency of light reaching the silicon light-sensitive layer. In backside-illuminated (BSI) sensors, light enters the silicon side of the chip and therefore does not require passing through the metal interconnect layers. Thus, BSI sensors are desirable for advance image sensing technology. However, BSI sensors require thinner silicon in order for the light to pass through and reach the photoactive layer and therefore have not been as cost-effective to manufacture as FSI sensors. BSI sensors also require precision uniformity in thickness across the chip, which can be difficult to accomplish.

One approach for manufacturing thin semiconductor wafers is utilizing epitaxial silicon, in which layers of silicon are grown on a bulk silicon substrate. The silicon substrate is a very thin sheet of typically less than 1.5 microns. Another approach is using a thicker silicon wafer and grinding it down to the desired thinness after the circuitry and interconnect layers have been formed. Because it is difficult to achieve the necessary precision uniformity in thickness with grinding, BSI processing often requires both wafer level grinding and die level polishing. This creates throughput issues, increases cost, and can cause contamination. Other factors in fabricating BSI sensors include differences in processing temperatures at the various stages of manufacturing, which greatly affects the materials and sequence of manufacturing steps, and the ability to handle thin films during fabrication.

SUMMARY OF THE INVENTION

A method for fabricating a backside-illuminated sensor includes providing a thin film semiconductor lamina having a first conductivity, and forming a doped region having a second conductivity within the lamina and at a front surface of the lamina. An electrical connection is formed to the doped region. A temporary carrier is contacted to the back surface of the semiconductor and later removed. A backside-illuminated sensor is fabricated from the semiconductor lamina, in which the thickness of the provided semiconductor lamina remains substantially unchanged during the fabrication.

In other embodiments, a method for fabricating a backside-illuminated sensor includes providing a semiconductor donor body having a first conductivity. A doped region of a second conductivity is formed at a first surface of the donor body and within the donor body. Ions are implanted into the first surface to define a cleave plane, and a semiconductor lamina is cleaved from the donor body. The doped region is included in the lamina, and an electrical connection is formed to the doped region. A temporary carrier is contacted to the back surface of the semiconductor and later removed. A backside-illuminated sensor is fabricated from the semiconductor lamina, in which the thickness of the semiconductor lamina remains substantially unchanged during the fabrication.

BRIEF DESCRIPTION OF THE DRAWINGS

Each of the aspects and embodiments of the invention described herein can be used alone or in combination with one another. The aspects and embodiments will now be described with reference to the attached drawings.

DETAILED DESCRIPTION OF THE EMBODIMENTS

A backside-illuminated sensor is fabricated using a lamina having a thickness substantially equivalent to the desired thickness for the finished sensor device. In some embodiments, the lamina may be provided as a free-standing lamina, in which doped regions are formed within and at a front surface of the lamina. In other embodiments, doped regions are formed in a first surface of a semiconductor donor body and a lamina is cleaved from the donor body, where the doped regions are within and at the front surface of the lamina. The methods disclosed herein enable improving throughput and decreasing manufacturing cost.

Figure 1:
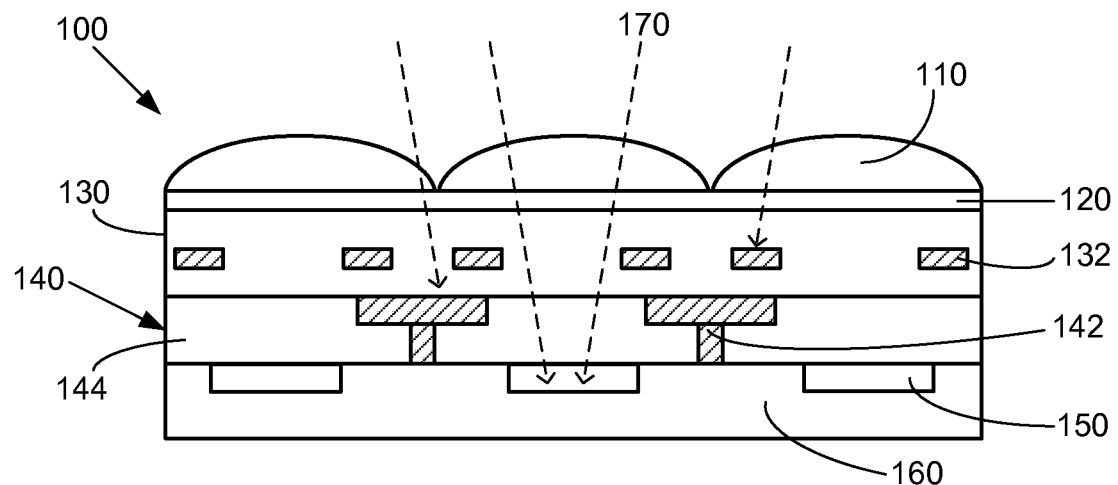
FIG. 1 depicts a cross-sectional view of a conventional frontside-illuminated sensor.

FIG. 1 shows a simplified view of a conventional FSI sensor 100 which includes lenses 110, color filter 120, integrated circuit 130, metal interconnect layer 140, doped regions 150 and semiconductor substrate 160. The semiconductor substrate 160 has a first conductivity and may be, for example, silicon. The doped regions 150 are doped to a different conductivity than the semiconductor substrate 160. For instance, the semiconductor substrate 160 may be a p-type conductor while the doped regions 150 may be n-type. A depletion zone forms at the p-n junction, creating an electric field. The p-n junction between the doped regions 150 and semiconductor substrate 160 forms a photodiode. Incident photons, indicated by arrows 170, will knock electrons from the valence band to the conduction band, creating free electron-hole pairs. Within the electric field at the p-n junction, electrons tend to migrate toward the n region of the diode, while holes migrate toward the p region, resulting in current, called photocurrent. Typically the dopant concentration of one region will be higher than that of the other, so that the junction is either an n−/p+ junction or a p−/n+ junction.

In the FSI sensor 100 of FIG. 1, metal interconnect layer 140 may include wiring or interconnects 142 and dielectric 144. Similarly, integrated circuit 130 also includes wiring 132. Light 170 enters the "front side" of the of the FSI sensor 100, where some light rays are blocked or reflected by wiring 132 and wiring 142. Light energy that reaches the doped regions 150 is then converted to electrical signals that are processed by integrated circuit 130.

Figure 2:
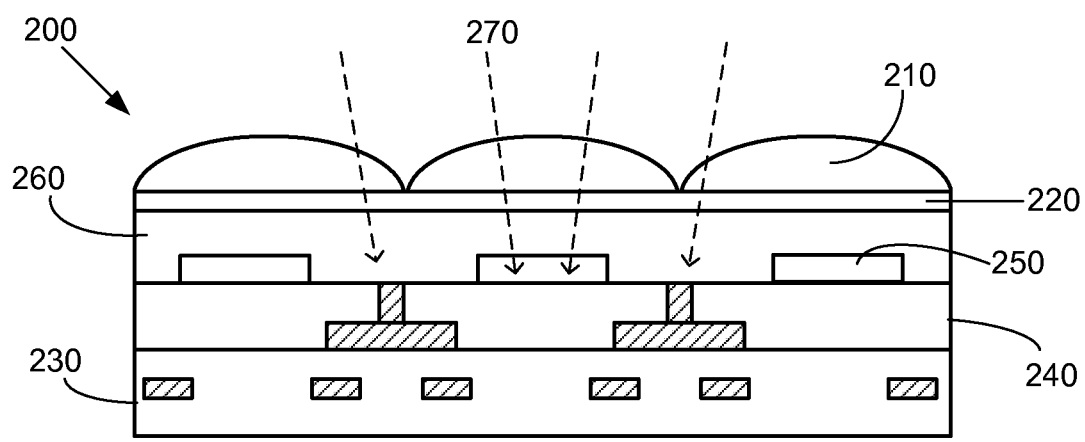
FIG. 2 depicts a cross-sectional view of a conventional backside-illuminated sensor.

FIG. 2 is a simplified diagram of a conventional BSI sensor 200. A BSI sensor is essentially an inverted FSI, so that light enters the back side, through the semiconductor substrate. In FIG. 2, incident light, indicated by arrows 270, enters lens 210 and passes through color filter 220, and then proceeds through semiconductor substrate 260 to diode regions 250, unhindered by wiring in metal interconnect layer 240 and integrated circuit 230. Thus, the efficiency of capturing photons is greatly increased for BSI sensors compared to FSI sensors. However, making the semiconductor substrate 260 thin enough to allow light to reach doped regions 250 can be very difficult, as the substrate 260 also requires high precision uniformity in thickness and avoiding damage to the thin film semiconductor during processing. Grinding is typically used to thin a silicon wafer; however, wafer level grinding commonly results in thickness variation across the wafer. Therefore, additional die level polishing is often performed. The need for multiple material removal steps creates various issues such as lower throughput, higher cost, increased risk of surface contamination, and potential for damage to the semiconductor substrate due to increased handling.

Figure 3A:
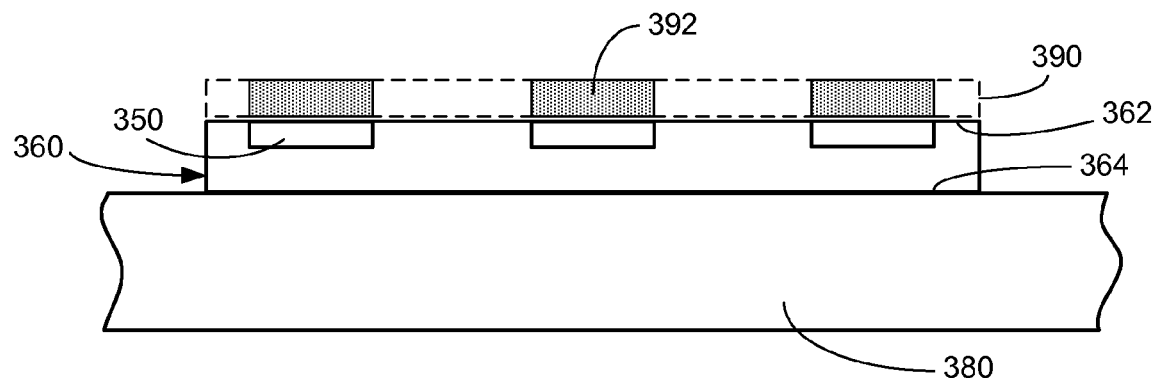
FIGS. 3A-3C are cross-sectional views of an embodiment of a backside-illuminated sensor in various stages of manufacturing.
Figure 3B:
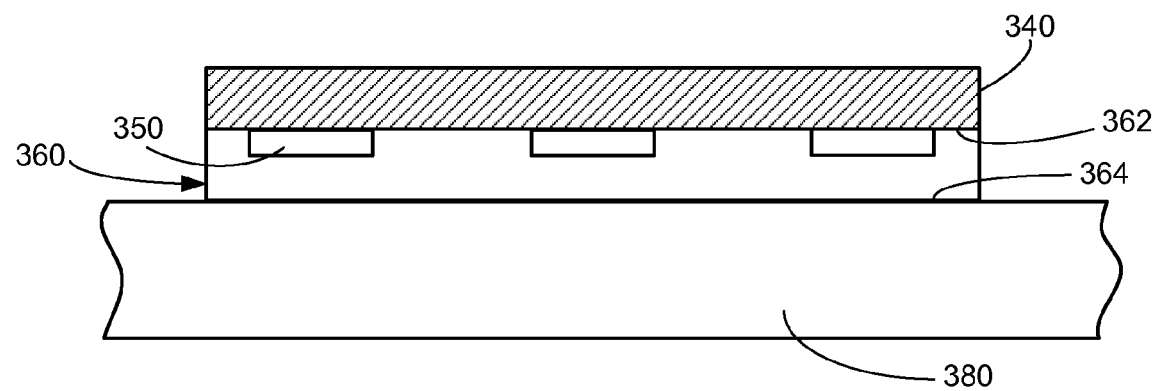
Figure 3C:
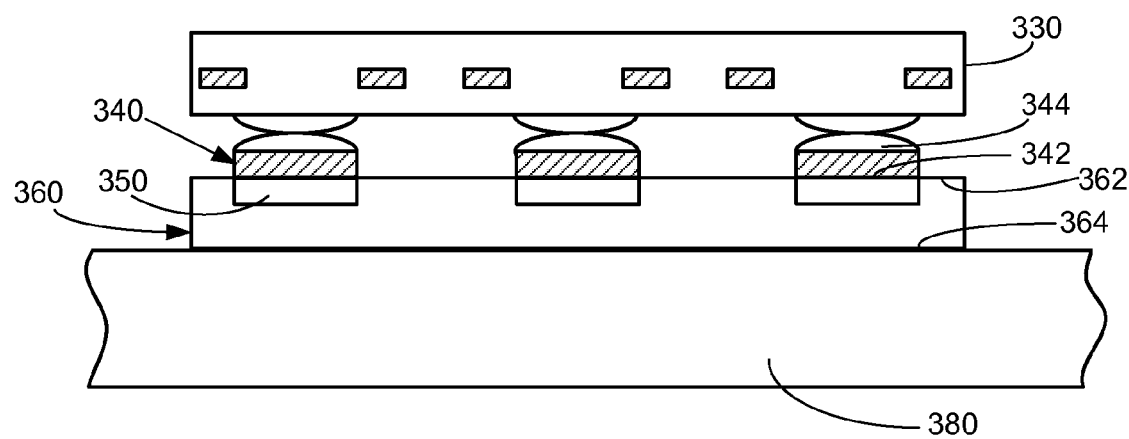

FIGS. 3A-3C depict cross-sectional views of an embodiment of the present disclosure, in which a BSI sensor is fabricated utilizing a thin film semiconductor lamina that already possesses a thickness substantially equivalent to the desired thickness required for the finished sensor assembly. The lamina may be less than 50 microns (μm) thick, such as between 1 and 20 μm or between 1 and 10 μm thick. The thickness of the provided lamina remains substantially unchanged, for example within at least 80% of its initially provided thickness, during processing steps for fabrication of the BSI sensor.

In FIG. 3A, a thin film semiconductor lamina 360 is provided, where semiconductor lamina 360 has a front surface 362, a back surface 364, and a first conductivity. The lamina 360 has a thickness measured between the front surface 362 and the back surface 364. Semiconductor lamina 360 may be contacted by a temporary support 380 at back surface 364 to aid in handling the thin film. Temporary support 380 may be contacted to lamina 360 by any type of separable force or adherence such as a vacuum, electrostatic or chemical force. In some embodiments, semiconductor lamina 360 may be a doped n-type or p-type monocrystalline silicon. The doping concentration may be, for example, between about $1 \times 10^{15}$ and about $1 \times 10^{18}$ dopant atoms/cm$^3$, or for example, about $1 \times 10^{17}$ dopant atoms/cm$^3$. One or more doped regions 350 are formed within semiconductor lamina 360 at front surface 362, where the doped regions 350 have a different conductivity than that of the semiconductor. One aspect of this invention is that doped regions may be formed on any lamina of any thickness, such as less than 50 μm thick. Another aspect of this invention is that imperfections in the lamina that may have been generated by an exfoliation process may be repaired before the fabrication of doped diode regions.

The doped regions 350 in FIG. 3A may be formed by methods known in the art, including diffusion doping. For example, as shown in FIG. 3A, a doped glass layer 390 may be formed on the front surface 362 by any method such as atmospheric pressure chemical vapor deposition (PCVD). For a p-type dopant, the doped glass layer 390 may be, for example, borosilicate glass (BSG) doped with boron. The source gas may be any suitable gas that will provide boron, for example, $BBr_3$, $B_2H_6$, or $BCl_3$. For an n-type dopant, an appropriate gas such as $POCl_3$ may be flowed at about 880° C. for about 30 minutes on front surface 362, forming phosphosilicate glass (PSG). In other embodiments, a dopant-providing material may be spun onto the front surface 362 and baked. In still other embodiments, the doped glass may be grown thermally, by flowing $O_2$ over a solid source such as BN. The doped glass layer 390 may have a thickness between, for example, about 500 and about 1500 angstroms, for example, about 1000 angstroms. Next, the doped glass 390 is removed in selected areas, for example by screen printing etchant paste, leaving glass regions 392 (shown as shaded areas) where the doped regions 350 are to be formed. Alternatively, doped regions 350 may be formed on front surface 362 by the deposition of amorphous silicon comprising an n-type dopant. In some embodiments, an intrinsic (undoped) layer of amorphous silicon may be interposed between the doped amorphous silicon layer and front surface 362.

In an alternative process for forming the doped regions 350, a layer of $Si_3N_4$ (not shown) may be deposited on the front surface 362. A screen print etchant paste is applied to etch the $Si_3N_4$, to mask any locations on front surface 362 in which doped regions 350 are not to be formed. Alternatively, conventional photolithographic techniques could be used to define these masked regions. Diffusion doping using a source of phosphorus (e.g., $POCl_3$) is performed to form n-type doped regions, or a boron-containing ambient (e.g., $BBr_3$) is used to form p-type regions in the exposed areas. Any remaining $Si_3N_4$ may be etched off at this time using known methods such as hydrofluoric acid (HF). A thin oxide layer may be grown on the wafer.

An anneal, for example between about 850 and about 1000° C., is performed in a furnace from between about 30 and about 90 minutes, and diffuses dopants from glass regions 392 into semiconductor lamina 360 at front surface 362. This diffusion forms either doped p-type (from, e.g., BSG) or n-type (from, e.g., PSG) regions 350. Next a conventional wet etch, for example an HF dip, removes the BSG or PSG, leaving doped regions 350 exposed at front surface 362. Boron and phosphorus are the most commonly used p-type and n-type dopants, respectively, but other dopants may be used.

After doped regions 350 have been formed in thin film semiconductor lamina 360, electrical connections may be formed as shown in FIG. 3B. In some embodiments, the electrical connection may include one or more sub-layers in metallization layer 340. The metallization layer 340 may be formed by, for example, sputter deposition using physical vapor deposition. The metallization layers 340 may comprise, for example, titanium, titanium-tungsten, or copper. Photolithography methods known in the art may be used to mask and etch the desired wiring patterns in metallization layers 340, to form electrical connections 342 to the doped regions 350, as depicted in FIG. 3C. Subsequent manufacturing steps may then be executed to fabricate a backside-illuminated sensor from the thin film semiconductor lamina 360. For instance, copper-tin, copper-indium or indium-tin bumps 344 may be electroplated onto the metallization layers 340 to facilitate bonding of integrated circuit 330. This bonding can be accomplished using any known method that will result in electrical connections between the integrated circuit and the lamina; for example, copper-copper thermo-compression bonding, or solid-liquid inter-diffusion bonding, using copper and tin or indium and indium or indium and tin. In some embodiments, integrated circuit 330 may be a complementary metal-oxide semiconductor (CMOS).

After the desired components have been constructed on the front surface 362 of thin film semiconductor 360, temporary support 380 is removed from back surface 364 of the lamina 360. A completed BSI sensor may be fabricated by adding, for example, coatings, color filters, and micro-lenses to back surface 364 (e.g., FIG. 2). As seen in the embodiments of FIGS. 3A-3C, the thickness of initially provided thin film semiconductor lamin 360 remains substantially unchanged during fabrication of the backside illuminated sensor, thus reducing issues created by grinding.

Figure 4:
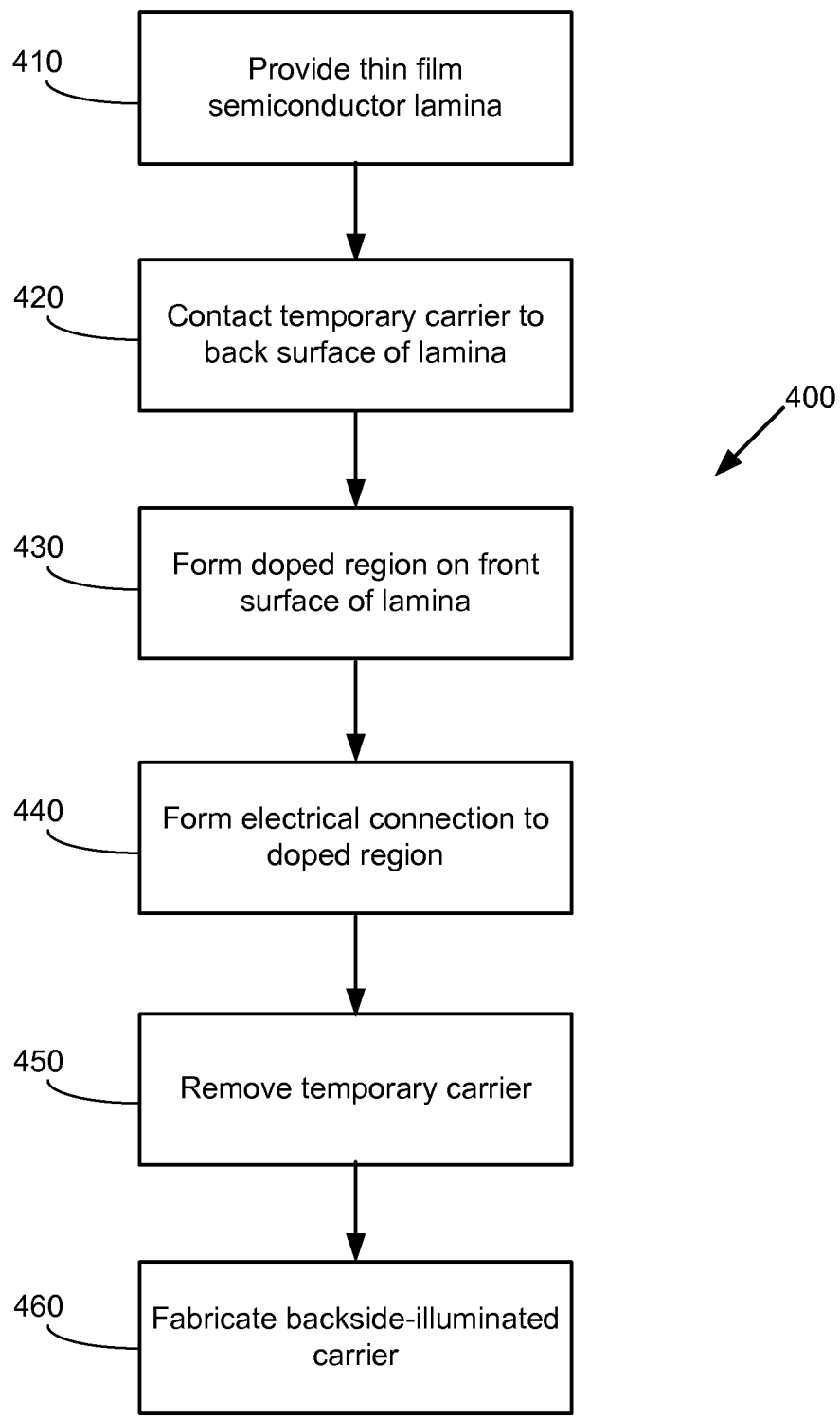
FIG. 4 is a flowchart of an exemplary method of the present invention.

Flowchart 400 of FIG. 4 illustrates the embodiments FIGS. 3A-3C. The exemplary method of flowchart 400 begins with providing a thin film semiconductor lamina in step 410. In step 420 a temporary carrier or support may be contacted to the back surface of the lamina, to support handling of the fragile lamina during processing. One or more doped regions are formed at the front surface of the lamina in step 430, where the doped regions have a conductivity opposite of the conductivity of the thin film semiconductor. In step 440, one or more electrical connections are formed to the doped region. The electrical connections may include, for example, metallization layers, solder bumps and thermo-compression interfaces. The temporary carrier is removed in step 450, after which a finished backside-illuminated sensor may be fabricated in step 460 by performing any additional manufacturing steps as desired on the back surface of the lamina. These finishing steps may include, for example, adding coatings, color filters and micro-lenses. The coatings may include layers that passivate the back surface of the lamina. These passivation layers may include a 10 Å-300 Å layer of hydrogenated amorphous silicon, deposited by plasma-enhanced chemical vapor deposition at a temperature of <450 C. The finishing steps may also include etching some material from the back surface of the lamina, to remove damage incurred during the cleaving implant process.

Figure 5A:
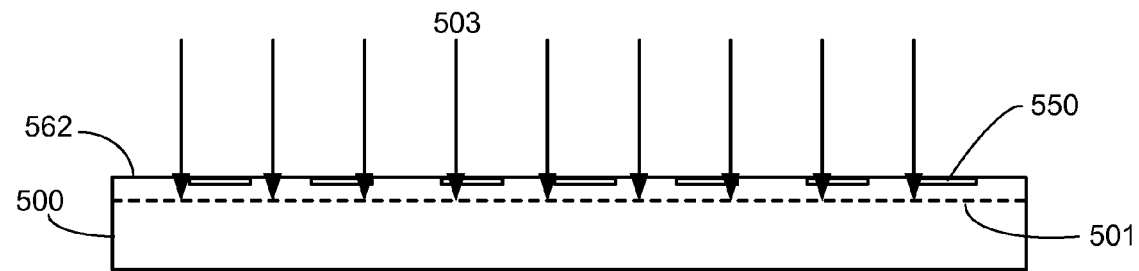
FIGS. 5A-5C show exemplary cross-sectional views of another embodiment of a backside-illuminated sensor in various stages of manufacturing.
Figure 5B:
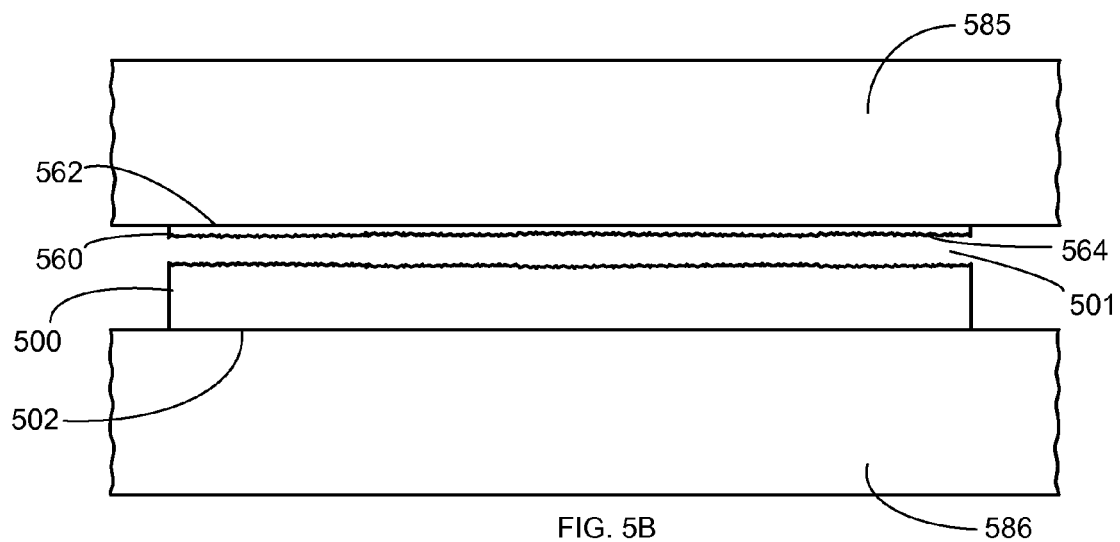
Figure 5C:
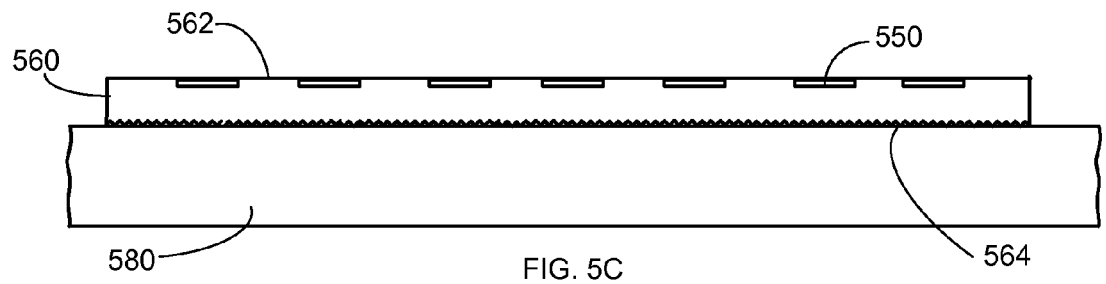

Another embodiment of the present disclosure is shown in FIGS. 5A-5C. In this embodiment, doped regions 550 of FIG. 5A are formed in a semiconductor donor body 500, and then a lamina is cleaved from the semiconductor donor body 500, where the lamina includes the doped regions 550. The donor body 500 is an appropriate semiconductor material such as a monocrystalline silicon wafer of any practical thickness, for example from about 200 to about 1000 microns thick. In alternative embodiments, the donor wafer may be thicker; maximum thickness is limited only by practicalities of wafer handling. Alternatively, wafers or ingots of other semiconductors materials, including germanium, silicon germanium, or III-V or II-VI semiconductor compounds such as GaAs, InP, etc may be used.

The process of forming monocrystalline silicon generally results in circular wafers, but the donor body can have other shapes as well. Cylindrical monocrystalline ingots are often machined to an octagonal cross section prior to cutting wafers. Multicrystalline wafers are often square. Square wafers have the advantage that, unlike circular or hexagonal wafers, they can be aligned edge-to-edge with minimal unused gaps between them. The diameter or width of the wafer may be any standard or custom size. For simplicity this disclosure will describe the use of a monocrystalline silicon wafer as the semiconductor donor body, but it will be understood that donor bodies of other types and materials can be used.

Exfoliation of a lamina comprising the doped regions 550 may occur by any means, including an ion induced cleavage reaction. Sivaram et al., U.S. patent application Ser. No. 12/026,530, "Method to Form a Photovoltaic Cell Comprising a Thin Lamina," filed Feb. 5, 2008, owned by the assignee of the present invention and hereby incorporated by reference, describes a semiconductor donor wafer (without doped regions 550) implanted with one or more species of gas ions, for example hydrogen and/or helium ions. The implanted ions define a cleave plane, such as cleave plane 501 of FIG. 5A, within the semiconductor donor wafer 500. Semiconductor donor wafer 500, also referred to as a donor body in this disclosure, has a first surface 562, which will become the front surface 562 of the later-exfoliated lamina. The gas ions are implanted (indicated by arrows 503) through first surface 562, to create cleave plane 501. The cost of this hydrogen or helium implant may reduced by methods described in Parrill et al., U.S. patent application Ser. No. 12/122,108, "Ion Implanter for Photovoltaic Cell Fabrication," filed May 16, 2008, owned by the assignee of the present invention and hereby incorporated by reference. The overall depth of cleave plane 501, as measured from first surface 562, is determined by several factors including implant energy. The depth of cleave plane 501 can be between about 0.2 and about 100 µm from first surface 562, for example between about 0.5 and about 20 µm; or between about 0.5 and about 50 µm, for example between about 1 and about 25 µm or between about 8 microns and about 20 µm. The depth of the cleave plane 501 will determine the thickness of cleaved lamina. Desirably, the thickness of cleaved lamina is chosen to be substantially equivalent to the desired thickness of a semiconductor substrate in the completed BSI sensor. Thus, a semiconductor substrate for a BSI according to embodiments of this invention may advantageously be produced with a specifically desired thickness and with a highly precise uniformity in thickness.

As shown in FIG. 5B, an anneal reaction causes lamina 560 to cleave from donor wafer 500 at cleave plane 501, where the cleave plane 501 creates back surface 564 of lamina 560. The first surface 562 of the semiconductor donor body 500 becomes front surface 562 of the lamina 560. Donor wafer 500 is affixed at first surface 562 to a temporary support element 585, which may be used to lift the lamina 560 from the semiconductor donor body 500.

According to embodiments of Sivaram et al., semiconductor lamina 560 may be between about 0.2 and about 100 µm thick, for example between about 0.2 and about 50 µm, for example between about 1 and about 25 µm thick, in some embodiments between about 5 and about 20 µm thick, though any thickness within the named range is possible. Using the methods of Sivaram et al., photovoltaic cells are formed of thin semiconductor laminae rather than being formed from sliced wafers, without wasting silicon through excessive kerf loss or by fabrication of an unnecessarily thick cell, thus reducing cost. The same donor wafer can be reused to form multiple laminae, further reducing cost, and may be resold after exfoliation of multiple laminae for some other use.

In the methods of Sivaram et al., though, the wafer must be contacted to a temporary or permanent support element early in the process in order to provide mechanical support to the thin lamina. Typically, lamina formed in this manner must either incorporate the support element into any resultant device or engage in a debonding step to remove the support element. In some embodiments of the present disclosure, a thin, free standing lamina may be formed and separated from a donor body without adhesive or permanent bonding to a support element and without requiring debonding or cleaning steps prior to fabricating a device from the lamina, beneficially providing for any number of processing steps to the front or back surface of the lamina. The first surface of the donor body 500—which will be the front surface of an exfoliated lamina—may be placed adjacent to support element 585 and an anneal step may be performed that exfoliates a lamina from the first surface of the donor body before or after the surface is treated with a processing step. The cleaved plane creates the back surface of the lamina, and once again, any number of processing steps may then occur on either side of the exfoliated lamina. These processes may occur in the absence of a bonded support element on the lamina as described in Kell et al., "A Method and Apparatus for Forming a Thin Lamina," U.S. patent application Ser. No. 13/331,909 filed Dec. 20, 2011 and hereby incorporated by reference.

Turning to FIG. 5C, prior to exfoliation, a second surface 502 of semiconductor donor body 500 of the present invention may be separably contacted to a temporary support element 586, such as a susceptor assembly. The contact between the donor body 500 and the support element 586 may comprise any type of separable force or adherence such as a vacuum, electrostatic or chemical force. In some embodiments the interacting force between the donor body 500 and the susceptor 586 during exfoliation of a lamina is solely the weight of the donor body 500 on the susceptor 586. In other embodiments where the exfoliation equipment has a configuration which is inverted vertically from that shown in FIG. 5B, the interacting force is solely the weight of the susceptor assembly 586 on the donor body. Following the contacting of the donor body 500 to the susceptor assembly 586, heat or other force may be applied to the donor body 500 to cleave lamina 560 from the donor body 500 at the cleave plane 501. Exfoliation conditions may be optimized to cleave the lamina from the donor body in order to minimize physical defects in a lamina exfoliated in the absence of a permanently adhered support element. Exfoliation may be performed at temperatures between, for example, about 350 and about 650 degrees C. In general, exfoliation proceeds more rapidly at higher temperature.

In cleaving lamina 560 from donor wafer 500 at cleave plane 501, a back surface 564 which is opposite of the front surface 562 on lamina 560 is created, as shown in FIG. 5C. Doped regions 550 are located at front surface 562 and within lamina 560. The lamina 560 may be annealed to remove any damage caused by the ion implantation. The free-standing lamina 560 may be temporarily contacted at either the front surface 562 or back surface 564 with a temporary support element. For example, support element 580 in FIG. 5C may contact back surface 564 during further manufacturing steps, and later removed, for fabricating the lamina 560 into a backside-illuminated sensor as described in relation to FIGS. 3B-3C above.

Note that the steps of implanting ions, cleaving the semiconductor donor body, and forming doped regions occur at high temperatures, such as above 450 degrees Celsius. Performing these high temperature steps in the early stages of fabricating a BSI sensor advantageously allows for the more thermally fragile materials to be used in later steps of fabricating the backside-illuminated sensor. In some embodiments of the present invention, during manufacture of a completed BSI sensor, only the steps of implanting ions, cleaving the semiconductor donor body, and forming the doped region have processing temperatures above about 450 degrees Celsius. In other embodiments, forming a doped region occurs prior to the step of implanting ions.

Figure 6:
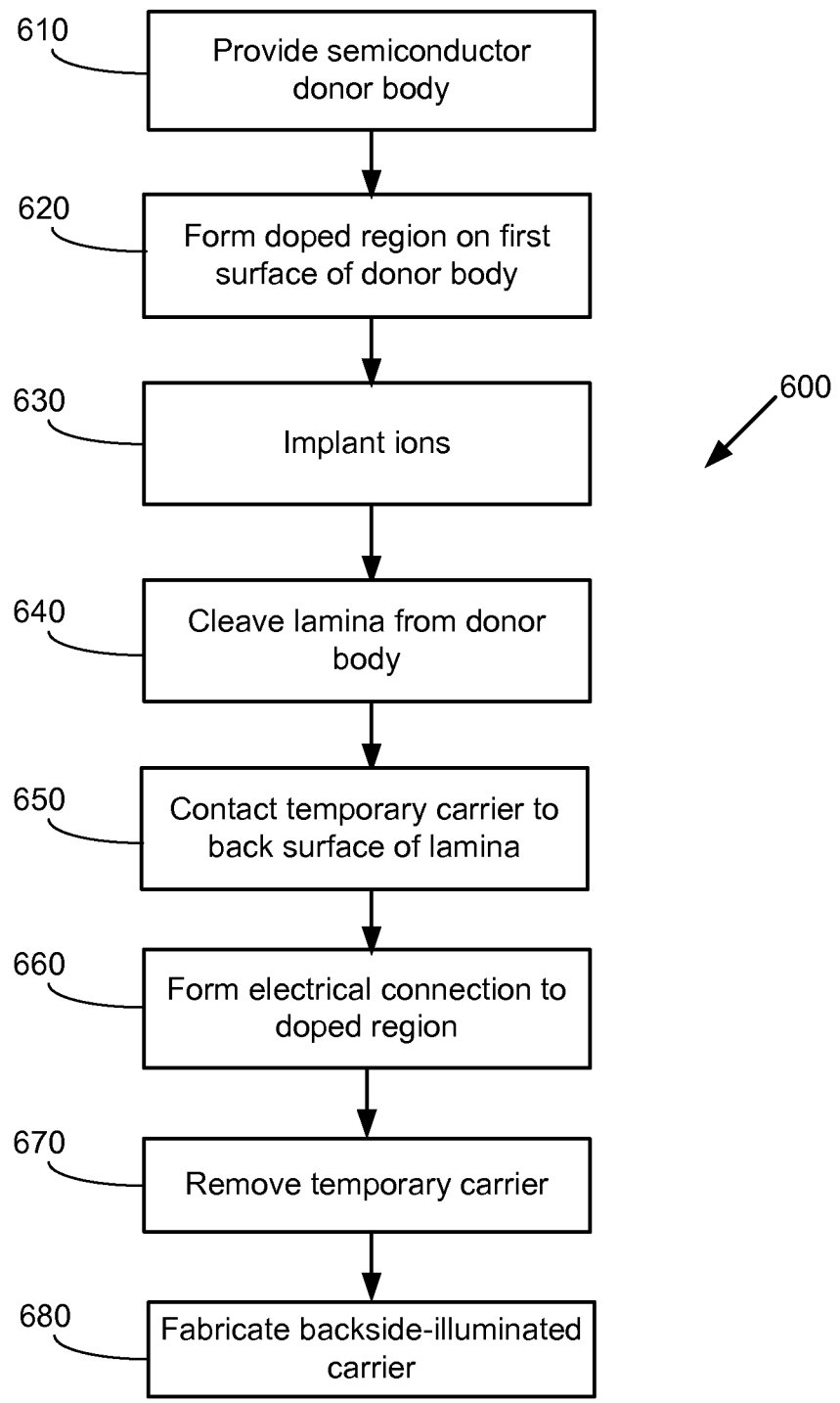
FIG. 6 is a flowchart of another exemplary method of the present invention.

Flowchart 600 of FIG. 6 illustrates an exemplary embodiment of the methods of FIGS. 5A-5C. In step 610, a semiconductor donor body is provided. One or more doped regions, which will serve as photodiodes of a finished BSI sensor assembly, are formed in the donor body in step 620. The doped regions are formed at a first surface of the donor body and have a conductivity that is different from the conductivity of the donor body. Ions are implanted into the semiconductor donor body to form a cleave plane in step 630, and then a semiconductor lamina is cleaved from the donor body in step 640. The first surface of the semiconductor body serves as the front surface of the lamina, and the cleave plane creates the back surface of the lamina. Furthermore, the doped regions are included at a front surface of the exfoliated lamina. In step 650 a temporary carrier or support is contacted to the back surface of the semiconductor lamina. Electrical connections, such as the metallization layers described above, are coupled to the doped regions on the front side of the lamina in step 660. The temporary carrier is removed in step 670. A finished backside-illuminated sensor may be fabricated in step 680 by performing any additional manufacturing steps desired on back surface of the lamina, such as those described in relation to step 460 of FIG. 4.

As discussed above, the embodiments of the present invention provide method of providing a lamina that does not require further thinning to achieve the desired thickness for a BSI sensor, thus reducing cost and improving and manufacturability. The thickness of the provided lamina remains substantially unchanged—such as being modified by not more than 20% of its initial thickness as a result of, for example, etching—during processing of the lamina and fabrication of the backside-illuminated sensor. Embodiments of the methods also involve doping the diode regions—processes which typically require high temperatures—early in the manufacturing process, consequently allowing for use of lower temperature materials and processes in subsequent fabrication steps.

Note that additional steps may be incorporated into the flowcharts described in this disclosure, without departing from the scope of the invention. For instance, in some embodiments a temporary support may also be contacted to the front surface. Similarly, temporary supports contacting either or both of the front and back surfaces may be used to transfer the lamina through the various steps involved with fabricating a finished BSI sensor assembly. In other embodiments, etching or other surface preparation processes may be performed. An etch step may serve to remove damage at the back surface of the lamina. This etch step may be performed, for example, by a wet or plasma treatment. The plasma treatment may occur, for example, in an $SF_6$ ambient. The amount etched may be <20% of the total lamina thickness.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the spirit and scope of the present invention, which is more particularly set forth in the appended claims. Furthermore, those of ordinary skill in the art will appreciate that the foregoing description is by way of example only, and is not intended to limit the invention.

What is claimed is:

1. A method of fabricating a backside-illuminated sensor, the method comprising the steps of:
   providing a thin film semiconductor lamina having a front surface, a back surface and a thickness between the front surface and the back surface, wherein the semiconductor lamina has a first conductivity, the semiconductor lamina having a doped region formed within the semiconductor lamina at the front surface of the lamina, wherein the doped region has a second conductivity;

contacting a temporary carrier to the back surface of the semiconductor lamina;

forming an electrical connection to the doped region at the front side of the semiconductor lamina;

removing the temporary carrier from the back surface; and fabricating a backside-illuminated sensor from the semiconductor lamina, wherein the thickness of the semiconductor lamina remains substantially unchanged during fabrication of the backside illuminated sensor.

2. The method of claim 1 wherein the step of providing the thin film semiconductor lamina further comprises:

providing a semiconductor donor body having a first surface, wherein the semiconductor donor body has the first conductivity;

implanting ions into the first surface of the semiconductor donor body to define a cleave plane; and cleaving the semiconductor donor body at the cleave plane, wherein the cleave plane forms the back surface of the semiconductor lamina and wherein the first surface of the semiconductor donor body forms the front surface of the semiconductor lamina.

3. The method of claim 2 wherein the step of providing the thin film semiconductor lamina further comprises forming the doped region within the semiconductor lamina; and wherein only the steps of implanting ions, cleaving the semiconductor donor body, and forming the doped region have processing temperatures above about 450 degrees Celsius.

4. The method of claim 3 wherein the step of forming the doped region occurs prior to the step of implanting ions.

5. The method of claim 2 wherein the step of implanting ions comprises an implant energy;

wherein the implant energy determines a depth of the cleave plane, the depth being measured from the first surface of the semiconductor donor body; and wherein the depth is chosen to be substantially equivalent to the thickness of the semiconductor lamina.

6. The method of claim 1 wherein the step of forming the electrical connection comprises the steps of:

applying a metallization layer to the front side of the semiconductor lamina; and coupling an integrated circuit to the metallization layer.

7. The method of claim 6 wherein the integrated circuit is a complementary metal-oxide semiconductor (CMOS).

8. The method of claim 1 further comprising the step of coupling a color filter to the back surface of the semiconductor lamina.

9. The method of claim 1 wherein the thickness of the thin film semiconductor lamina is less than about 25 microns.

10. The method of claim 1 wherein the thickness of the thin film semiconductor lamina is between about 1 micron to about 50 microns.

11. The method of claim 1 wherein the thickness of the semiconductor lamina remains within a 20% deviation of its initially provided thickness during fabrication of the backside illuminated sensor.

12. A method of fabricating a backside-illuminated sensor, the method comprising the steps of:

providing a semiconductor donor body having a first surface and a first conductivity;

forming a doped region within the semiconductor donor body at the first surface, wherein the doped region has a second conductivity;

implanting ions into the first surface of the semiconductor donor body to define a cleave plane;

cleaving a semiconductor lamina from the semiconductor donor body at the cleave plane, wherein the cleave plane forms a back surface of the semiconductor lamina, wherein the first surface of the semiconductor donor body is a front surface of the semiconductor lamina, and wherein the front surface includes the doped region;

contacting a temporary carrier to the back surface of the semiconductor lamina;

forming an electrical connection to the doped region on the front side of the semiconductor lamina;

removing the temporary carrier from the back surface; and fabricating a backside-illuminated sensor from the semiconductor lamina, wherein a thickness between the front side and the back surface of the semiconductor lamina remains substantially unchanged during fabrication of the backside-illuminated sensor;

wherein the thickness of the cleaved semiconductor lamina is substantially equivalent to a desired final thickness of a semiconductor substrate in the fabricated backside-illuminated sensor.

13. A method of fabricating a backside-illuminated sensor, the method comprising the steps of:

providing a semiconductor donor body having a first surface and a first conductivity;

forming a doped region within the semiconductor donor body at the first surface, wherein the doped region has a second conductivity;

implanting ions into the first surface of the semiconductor donor body to define a cleave plane;

cleaving a semiconductor lamina from the semiconductor donor body at the cleave plane, wherein the cleave plane forms a back surface of the semiconductor lamina, wherein the first surface of the semiconductor donor body is a front surface of the semiconductor lamina, and wherein the front surface includes the doped region;

contacting a temporary carrier to the back surface of the semiconductor lamina;

forming an electrical connection to the doped region on the front side of the semiconductor lamina;

removing the temporary carrier from the back surface; and fabricating a backside-illuminated sensor from the semiconductor lamina, wherein a thickness between the front side and the back surface of the semiconductor lamina remains substantially unchanged during fabrication of the backside-illuminated sensor;

wherein only the steps of forming the doped region, implanting ions, and cleaving the semiconductor donor body have processing temperatures above about 450 degrees Celsius.

* * * * *

UNITED STATES PATENT AND TRADEMARK OFFICE
CERTIFICATE OF CORRECTION

PATENT NO. : 8,871,608 B2  
APPLICATION NO. : 13/425877  
DATED : October 28, 2014  
INVENTOR(S) : Venkatesan Murali et al.

Page 1 of 1

It is certified that error appears in the above-identified patent and that said Letters Patent is hereby corrected as shown below:

In the drawings,

Sheet 3 of 5, Figure 4, box 460, please delete "carrier" and insert --sensor--.

Sheet 5 of 5, Figure 6, box 680, please delete "carrier" and insert --sensor--.

Signed and Sealed this
Seventeenth Day of March, 2015

Michelle K. Lee
*Director of the United States Patent and Trademark Office*